(12) United States Patent
Tanaka

(10) Patent No.: US 12,362,719 B2
(45) Date of Patent: Jul. 15, 2025

(54) RESONANT DEVICE COMPRISING PLANE ELECTRODES ARRANGED IN AN EXTENDING DIRECTION, WHERE THE PLANE ELECTRODES INCLUDE OVERLAPPING PROJECTING PORTIONS

(71) Applicant: Murata Manufacturing Co., Ltd., Nagaokakyo (JP)

(72) Inventor: Akira Tanaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 239 days.

(21) Appl. No.: 18/101,719

(22) Filed: Jan. 26, 2023

(65) Prior Publication Data

US 2023/0179166 A1     Jun. 8, 2023

Related U.S. Application Data

(63) Continuation of application No. PCT/JP2021/032071, filed on Sep. 1, 2021.

(30) Foreign Application Priority Data

Sep. 29, 2020   (JP) ................. 2020-163253

(51) Int. Cl.
*H03H 7/01*       (2006.01)
*H01F 27/28*      (2006.01)
(Continued)

(52) U.S. Cl.
CPC ....... *H03H 7/0115* (2013.01); *H01F 27/2804* (2013.01); *H01F 27/29* (2013.01);
(Continued)

(58) Field of Classification Search
CPC ............................ H01P 1/20345; H01P 7/115
(Continued)

(56) References Cited

U.S. PATENT DOCUMENTS

2007/0241839 A1   10/2007   Taniguchi
2013/0154769 A1   6/2013    Masuda
2021/0242851 A1   8/2021    Yasuda et al.

FOREIGN PATENT DOCUMENTS

CN     101421918 A    4/2009
EP     2009787 A1     12/2008
(Continued)

OTHER PUBLICATIONS

International Search Report in PCT/JP2021/032071, mailed Nov. 2, 2021, 3 pages.
(Continued)

*Primary Examiner* — Benny T Lee
(74) *Attorney, Agent, or Firm* — Keating & Bennett, LLP

(57) ABSTRACT

In a resonant device, a third plane electrode is located between a first plane electrode and a second plane electrode. A first via electrode connects the first plane electrode and the third plane electrode. A second via electrode, a third via electrode, and a fourth via electrode connect the first plane electrode and the second plane electrode. When the third plane electrode is seen in plan view in a normal direction of the first plane electrode, the third plane electrode includes a first projecting portion overlapping with a first area between the second via electrode and the third via electrode, and a second projecting portion overlapping with a second area between the third via electrode and the fourth via electrode.

22 Claims, 13 Drawing Sheets

(51) Int. Cl.
    *H01F 27/29*     (2006.01)
    *H01G 4/012*     (2006.01)
    *H01G 4/30*     (2006.01)
    *H01P 1/203*     (2006.01)

(52) U.S. Cl.
    CPC ............... *H01G 4/012* (2013.01); *H01G 4/30* (2013.01); *H01P 1/20345* (2013.01); *H03H 7/1766* (2013.01)

(58) Field of Classification Search
    USPC ........................................................ 333/185
    See application file for complete search history.

(56) References Cited

FOREIGN PATENT DOCUMENTS

| | | | |
|---|---|---|---|
| JP | 2013128232 | A | 6/2013 |
| TW | 202027415 | A | 7/2020 |
| WO | 2007119356 | A1 | 10/2007 |
| WO | 2020105257 | A1 | 5/2020 |

OTHER PUBLICATIONS

Written Opinion in PCT/JP2021/032071, mailed Nov. 2, 2021, 4 pages.

RESONANT DEVICE COMPRISING PLANE ELECTRODES ARRANGED IN AN EXTENDING DIRECTION, WHERE THE PLANE ELECTRODES INCLUDE OVERLAPPING PROJECTING PORTIONS

CROSS REFERENCE TO RELATED APPLICATIONS

This application claims the benefit of priority to Japanese Patent Application No. 2020-163253 filed on Sep. 29, 2020 and is a Continuation Applications of PCT Application No. PCT/JP2021/032071 filed on Sep. 1, 2021. The entire contents of each application are hereby incorporated herein by reference.

BACKGROUND OF THE INVENTION

1. Field of the Invention

The present invention relates to a resonant device and a filter including the resonant device.

2. Description of the Related Art

Conventionally, resonant devices have been known. For example, International Publication No. 2020/105257 discloses a resonant device with a plurality of via electrodes formed inside a dielectric. The plurality of via electrodes constitute an inductor, and thus, a percentage of the dielectric in the resonant device increases. As a result, intensity of the resonant device can be increased.

SUMMARY OF THE INVENTION

In the resonant device disclosed in International Publication No. 2020/105257, a magnetic field of the inductor connected to a plane electrode may be interrupted by an electric field generated from an end portion of the plane electrode. Since inductance of the inductor decreases, a quality factor of the inductor may be reduced. As a result, a quality factor of the resonant device may be reduced.

Preferred embodiments of the present invention provide resonant devices with improved performance.

A resonant device according to a preferred embodiment of the present invention includes a first plane electrode, a second plane electrode, a third plane electrode, a first via electrode, a second via electrode, a third via electrode, and a fourth via electrode. The third plane electrode is located between the first plane electrode and the second plane electrode in a normal direction of the first plane electrode. The first via electrode connects the first plane electrode and the third plane electrode. The second to fourth via electrodes connect the first plane electrode and the second plane electrode. The second via electrode and the third via electrode are positioned along a first direction perpendicular or substantially perpendicular to an extending direction of the first via electrode. The third via electrode and the fourth via electrode are positioned along a second direction perpendicular or substantially perpendicular to the extending direction and different from the first direction. When the third plane electrode is seen in plan view in the normal direction of the first plane electrode, the first plane electrode, the second plane electrode, or the third plane electrode includes a first projecting portion overlapping with one of a first area between the second via electrode and the third via electrode and a second area between the third via electrode and the fourth via electrode, and the third plane electrode includes a second projecting portion overlapping with at least one of the first area and the second area and different from the first projecting portion.

According to a resonant device of a preferred embodiment of the present invention, when the third plane electrode is seen in plan view in the normal direction of the first plane electrode, the first plane electrode, the second plane electrode, or the third plane electrode includes the first projecting portion overlapping with one of the second via first area and the second area, and the third plane electrode includes the second projecting portion overlapping with at least one of the first area and the second area. Therefore, performance of the resonant device can be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
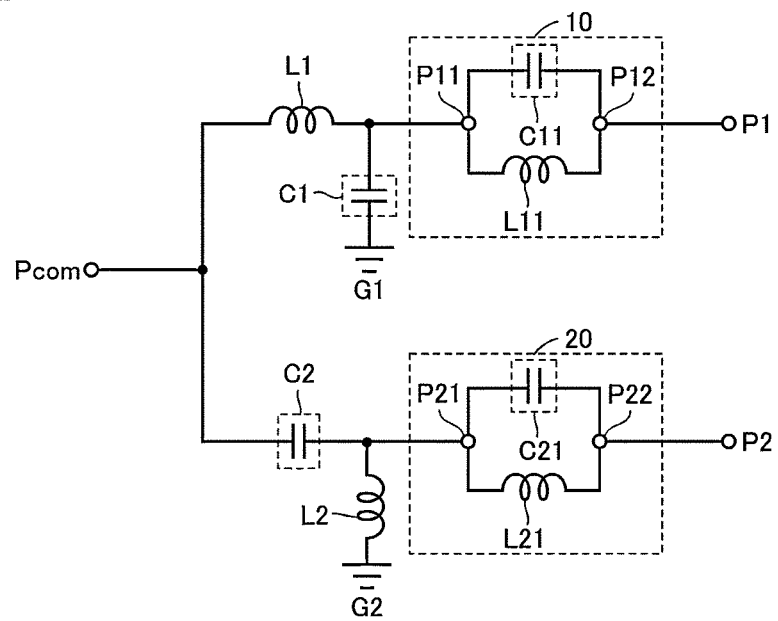
FIG. 1 is an equivalent circuit diagram of a diplexer as one example of a filter according to Preferred Embodiment 1 of the present invention.

Hereinafter, preferred embodiments are described in detail with reference to the drawings. Note that the same reference characters are given to the same or corresponding elements described in the detailed description of the drawings, and description thereof is not repeated in general.

Preferred Embodiment 1

FIG. 1 is an equivalent circuit diagram of a diplexer 1 as one example of a filter according to Preferred Embodiment 1. As illustrated in FIG. 1, the diplexer 1 includes a common terminal Pcom, terminals P1 and P2, inductors L1 and L2, capacitors C1 and C2, and resonant devices 10 and 20. A resonant frequency of the resonant device 20 is different from a resonant frequency of the resonant device 10.

The resonant device 10 includes terminals P11 and P12, an inductor L11, and a capacitor C11. The inductor L11 and the capacitor C11 are connected in parallel between the terminals P11 and P12. The resonant device 10 includes an LC parallel resonant circuit.

The inductor L1 is connected between the common terminal Pcom and the terminal P11. The capacitor C1 is connected between a ground terminal G1, which is a ground point, and the terminal P11. The terminal P1 is connected to the terminal P12.

The resonant device 20 includes terminals P21 and P22, an inductor L21, and a capacitor C21. The inductor L21 and the capacitor C21 are connected in parallel between the terminals P21 and P22. The resonant device 20 includes an LC parallel resonant circuit.

The capacitor C2 is connected between the common terminal Pcom and the terminal P21. The inductor L2 is connected between a ground terminal G2, which is a ground point, and the terminal P21. The terminal P2 is connected to the terminal P22.

Figure 2:
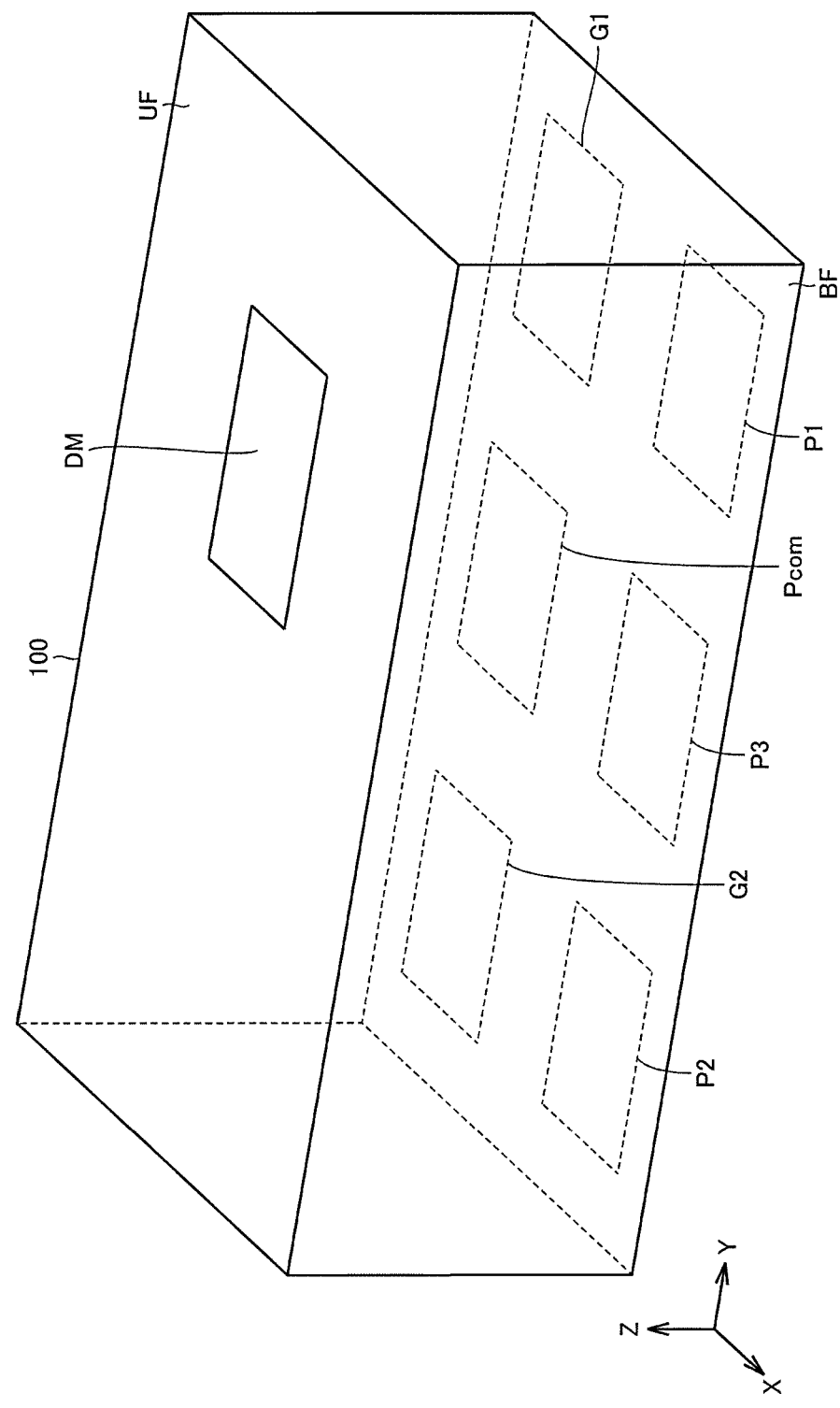
FIG. 2 is an external perspective view of the diplexer of FIG. 1.

FIG. 2 is an external perspective view of the diplexer 1 of FIG. 1. An X-axis, a Y-axis, and a Z-axis illustrated in FIG. 2 are orthogonal to each other, which is also the same in FIGS. 3 to 14. A plurality of dielectric layers are laminated in the Z-axis direction in a multilayer body 100. Inside the multilayer body 100, a plurality of electrodes included in the equivalent circuit illustrated in FIG. 1 are provided.

As illustrated in FIG. 2, a direction distinguishing mark DM is provided on an upper surface UF of the diplexer 1. The common terminal Pcom, the terminals P1, P2, and P3, and the ground terminals G1 and G2 are provided on a bottom surface BF of the diplexer 1. The common terminal Pcom, the terminals P1 to P3, and the ground terminals G1 and G2 are, for example, land grid array (LGA) terminals where plane electrodes are regularly positioned on the bottom surface BF. The bottom surface BF of the diplexer 1 is connected to a circuit board (not illustrated).

Figure 3:
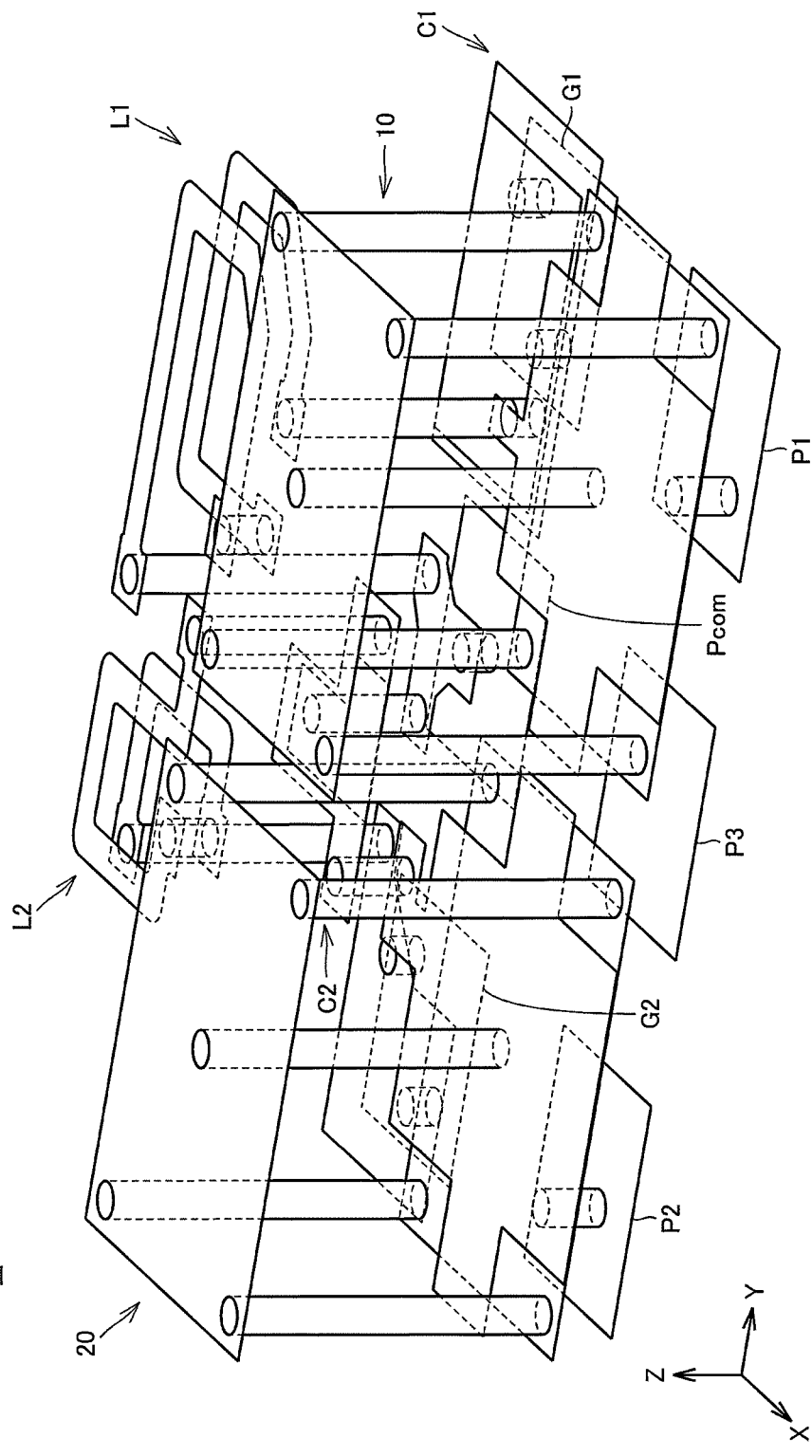
FIG. 3 is a perspective view of a plurality of electrodes inside a multilayer body of FIG. 2.

FIG. 3 is a perspective view of a plurality of electrodes located inside the multilayer body 100 of FIG. 2. In order to facilitate understanding of an electrode structure provided by the plurality of electrodes, the plurality of electrodes illustrated in FIG. 3 will be described below while being divided into the plurality of electrodes of the resonant devices 10 and 20 and the plurality of electrodes of the inductors L1 and L2 and the capacitors C1 and C2.

Figure 4:
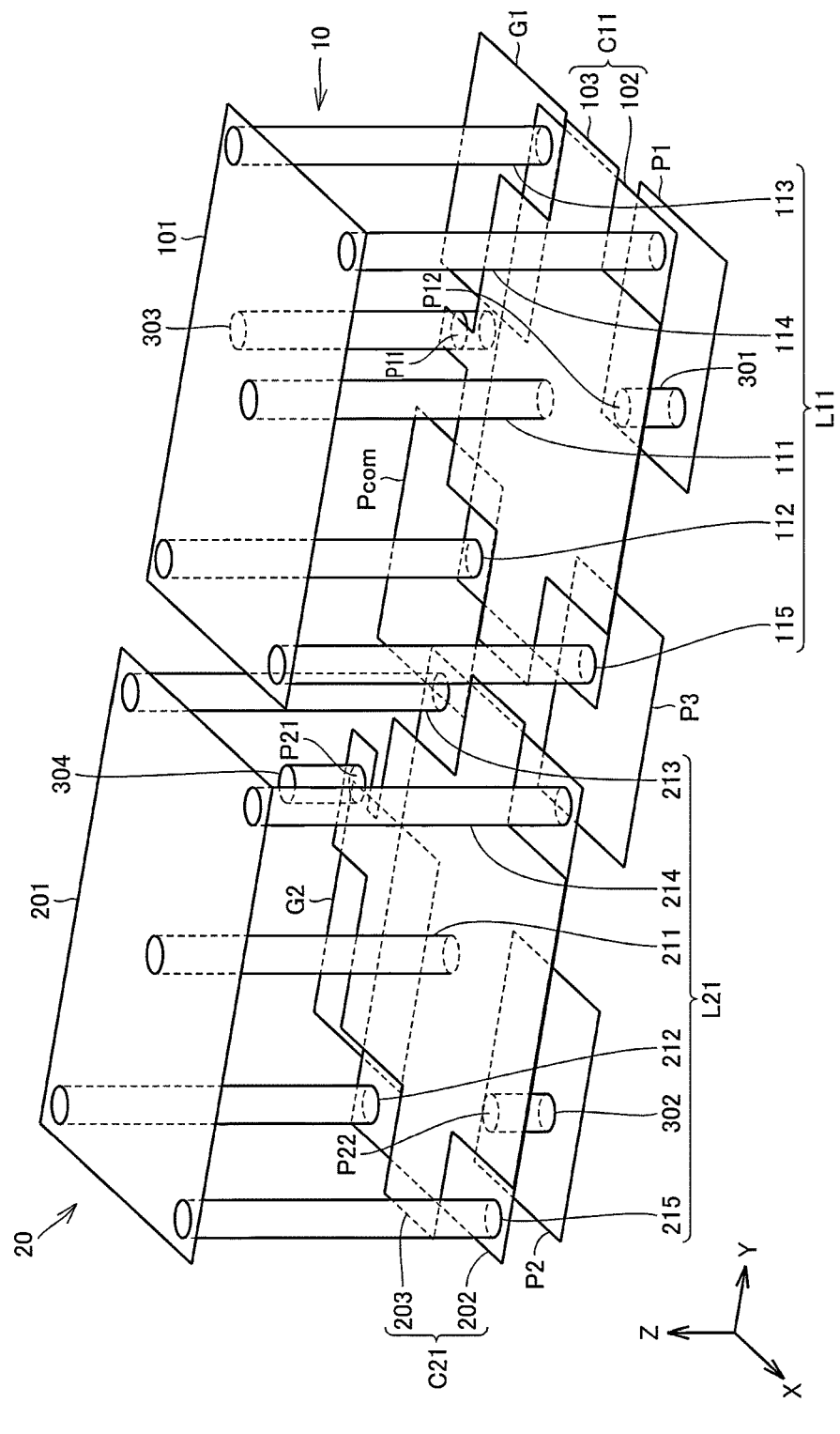
FIG. 4 is a perspective view of a plurality of electrodes of resonant devices of FIG. 3.
Figure 5:
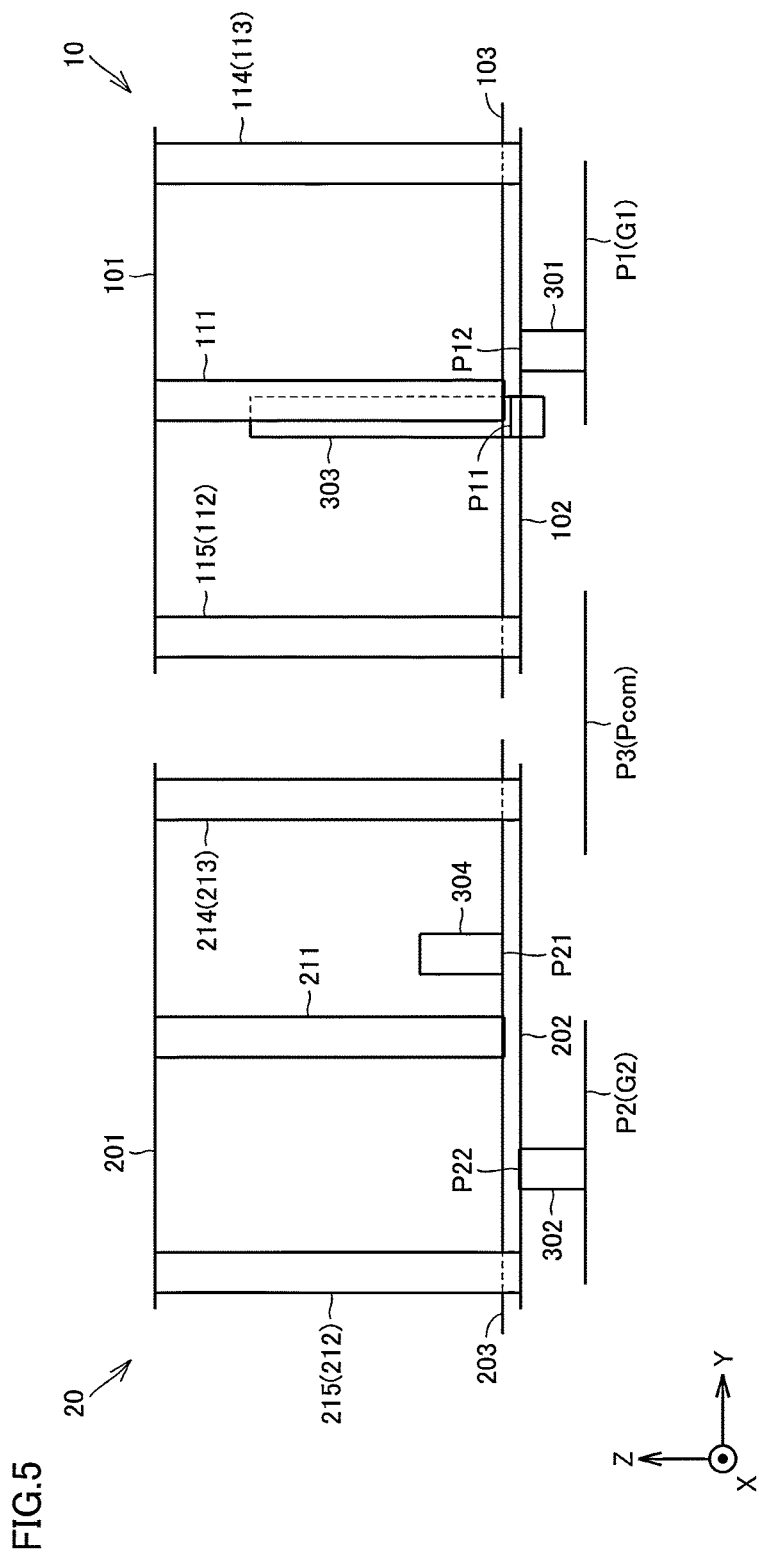
FIG. 5 is a plan view of the resonant devices of FIG. 4 when seen in an X-axis direction.
Figure 6:
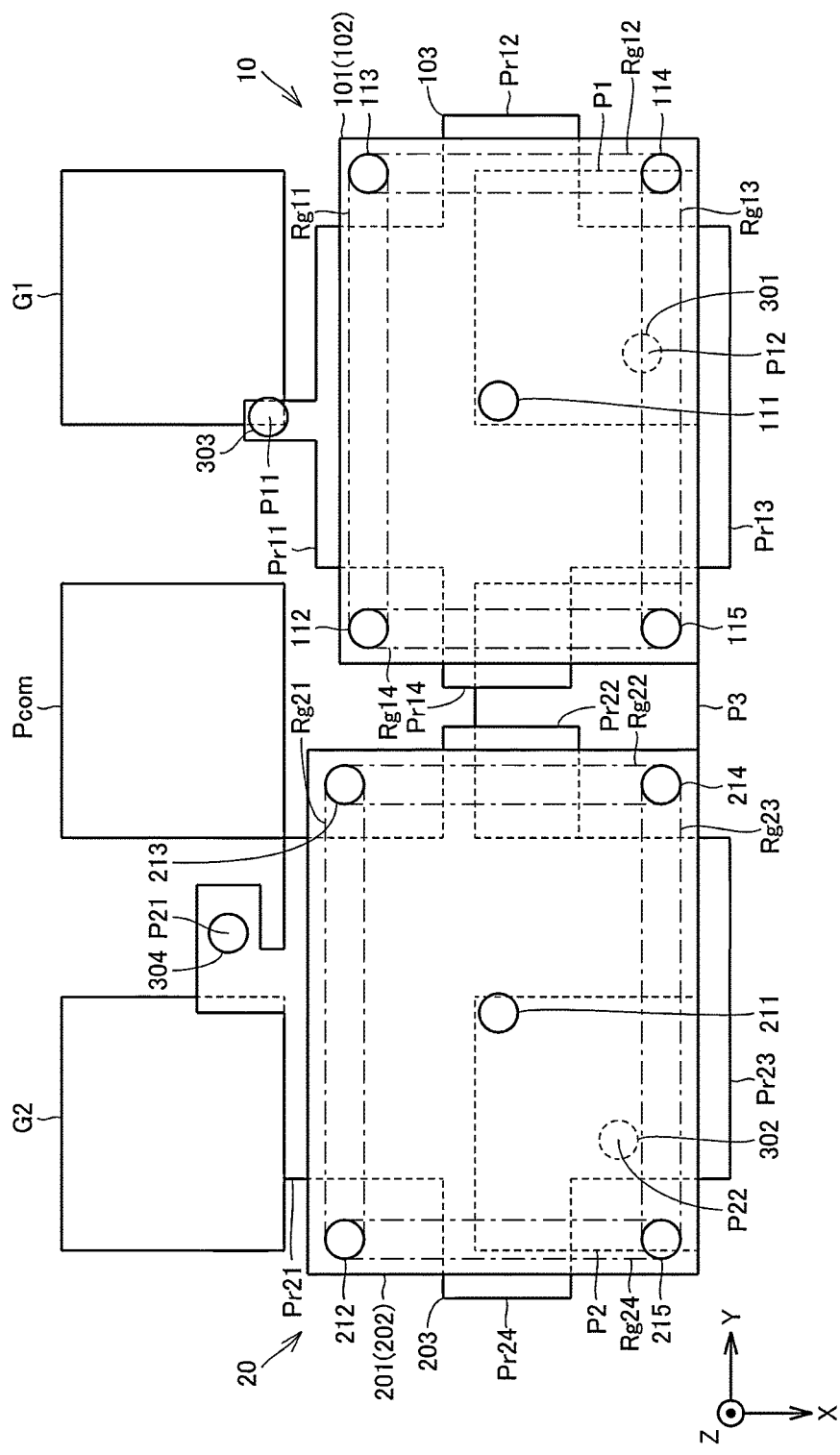
FIG. 6 is a plan view of the resonant devices of FIG. 4 when seen in a Z-axis direction.

FIG. 4 is a perspective view of the plurality of electrodes constituting the resonant devices 10 and 20 of FIG. 3. FIG. 5 is a plan view of the resonant devices 10 and 20 of FIG. 4 when seen in the X-axis direction. FIG. 6 is a plan view of the resonant devices 10 and 20 of FIG. 4 when seen in the Z-axis direction.

As illustrated in FIGS. 4 to 6, the resonant device 10 includes a plane electrode 101 (first plane electrode), a plane electrode 102 (second plane electrode), a plane electrode 103 (third plane electrode), a via electrode 111 (first via electrode), a via electrode 112 (second via electrode), a via electrode 113 (third via electrode), a via electrode 114 (fourth via electrode), and a via electrode 115 (fifth via electrode).

The plane electrode 103 is located between the plane electrodes 101 and 102 in a normal direction (Z-axis direction) of the plane electrode 101. The via electrode 111 extends in the Z-axis direction (extending direction) and connects the plane electrodes 101 and 103. The via electrodes 112, 113, 114, and 115 extend in the Z-axis direction and connect the plane electrodes 101 and 102.

The plane electrode 103 is connected to a via electrode 303. The terminal P11 is located at a connection between the plane electrode 103 and the via electrode 303. By the terminal P11 being provided in or on the plane electrode 103, the via electrode 111 can be included in an inductor L11 of the resonant device 10, and thus, inductance of the inductor L11 can be increased.

A via electrode 301 connects the plane electrode 102 and the terminal P1. The terminal P12 is located at a connection between the plane electrode 102 and the via electrode 301.

The via electrode 111 is shorter than each of the via electrodes 112 to 115. A distance between the plane electrodes 103 and 102 is shorter than a distance between the plane electrodes 103 and 101.

The via electrodes 111 to 115 define the inductor L11. The plane electrodes 102 and 103 are opposed to each other in the Z-axis direction and define the capacitor C11.

The resonant device 20 includes a plane electrode 201 (first plane electrode), a plane electrode 202 (second plane electrode), a plane electrode 203 (third plane electrode), a via electrode 211 (first via electrode), a via electrode 212 (second via electrode), a via electrode 213 (third via electrode), a via electrode 214 (fourth via electrode), and a via electrode 215 (fifth via electrode).

The plane electrode 203 is located between the plane electrodes 201 and 202 in a normal direction of the plane electrode 201. The via electrode 211 extends in the Z-axis direction and connects the plane electrodes 201 and 203. The via electrodes 212 to 215 extend in the Z-axis direction and connect the plane electrodes 201 and 202.

The plane electrode 203 is connected to a via electrode 304. The terminal P21 is located at a connection between the plane electrode 203 and the via electrode 304. By the terminal P21 being provided in or on the plane electrode 203, the via electrode 211 can be included in an inductor L21 of the resonant device 20, and thus, inductance of the inductor L21 can be increased.

A via electrode 302 connects the plane electrode 202 and the terminal P2. The terminal P22 is located at a connection between the plane electrode 202 and the via electrode 302.

The via electrode 211 is shorter than each of the via electrodes 212, 213, 214, and 215. A distance between the plane electrodes 203 and 202 is shorter than a distance between the plane electrodes 203 and 201.

The via electrodes 211 to 215 define the inductor L21. The plane electrodes 202 and 203 are opposed to each other in the Z-axis direction and define the capacitor C21.

As illustrated in FIG. 6, the via electrodes 112 and 113 are positioned along the Y-axis direction (first direction). The via electrodes 113 and 114 are positioned along the X-axis direction (second direction). The via electrodes 114 and 115 are positioned along the Y-axis direction. The via electrodes 115 and 112 are positioned along the X-axis direction.

When the plane electrode 103 is seen in plan view in the Z-axis direction, the plane electrode 103 overlaps with each of a range Rg11 (first area) between the via electrodes 112 and 113, a range Rg12 (second area) between the via electrodes 113 and 114, a range Rg13 (third area) between the via electrodes 114 and 115, and a range Rg14 (fourth area) between the via electrodes 115 and 112. That is, the plane electrode 103 includes a projecting portion Pr11 overlapping with the range Rg11, a projecting portion Pr12 overlapping with the range Rg12, a projecting portion Pr13 overlapping with the range Rg13, and a projecting portion Pr14 overlapping with the range Rg14.

The projecting portion Pr11 is sandwiched between the via electrodes 112 and 113. The projecting portion Pr12 is sandwiched between the via electrodes 113 and 114. The projecting portion Pr13 is sandwiched between the via electrodes 114 and 115. The projecting portion Pr14 is sandwiched between the via electrodes 115 and 112.

A portion of the projecting portion Pr11 is not overlapped with the plane electrodes 101 and 102. The terminal P11 is located at the portion of the projecting portion Pr11 not overlapped with the plane electrodes 101 and 102. A portion of the projecting portion Pr12 is not overlapped with the plane electrodes 101 and 102. A portion of the projecting portion Pr13 is not overlapped with the plane electrodes 101 and 102. A portion of the projecting portion Pr14 is not overlapped with the plane electrodes 101 and 102.

The via electrodes 212 and 213 are positioned along the Y-axis direction. The via electrodes 213 and 214 are positioned along the X-axis direction. The via electrodes 214 and 215 are positioned along the Y-axis direction. The via electrodes 215 and 212 are positioned along the X-axis direction.

When the plane electrode 203 is seen in plan view in the Z-axis direction, the plane electrode 203 overlaps with each of a range Rg21 (first area) between the via electrodes 212 and 213, a range Rg22 (second area) between the via electrodes 213 and 214, a range Rg13 (third area) between the via electrodes 214 and 215, and a range Rg24 (fourth area) between the via electrodes 215 and 212. That is, the plane electrode 203 includes a projecting portion Pr21 overlapping with the range Rg21, a projecting portion Pr22 overlapping with the range Rg22, a projecting portion Pr23 overlapping with the range Rg23, and a projecting portion Pr24 overlapping with the range Rg24.

The projecting portion Pr21 is sandwiched between the via electrodes 212 and 213. The projecting portion Pr22 is sandwiched between the via electrodes 213 and 214. The projecting portion Pr23 is sandwiched between the via electrodes 214 and 215. The projecting portion Pr24 is sandwiched between the via electrodes 215 and 212.

A portion of the projecting portion Pr21 is not overlapped with the plane electrodes 201 and 202. The terminal P21 is located at the portion of the projecting portion Pr21 not overlapped with the plane electrodes 201 and 202. A portion of the projecting portion Pr22 is not overlapped with the plane electrodes 201 and 202. A portion of the projecting portion Pr23 is not overlapped with the plane electrodes 201 and 202. A portion of the projecting portion Pr24 is not overlapped with the plane electrodes 201 and 202.

Figure 7:
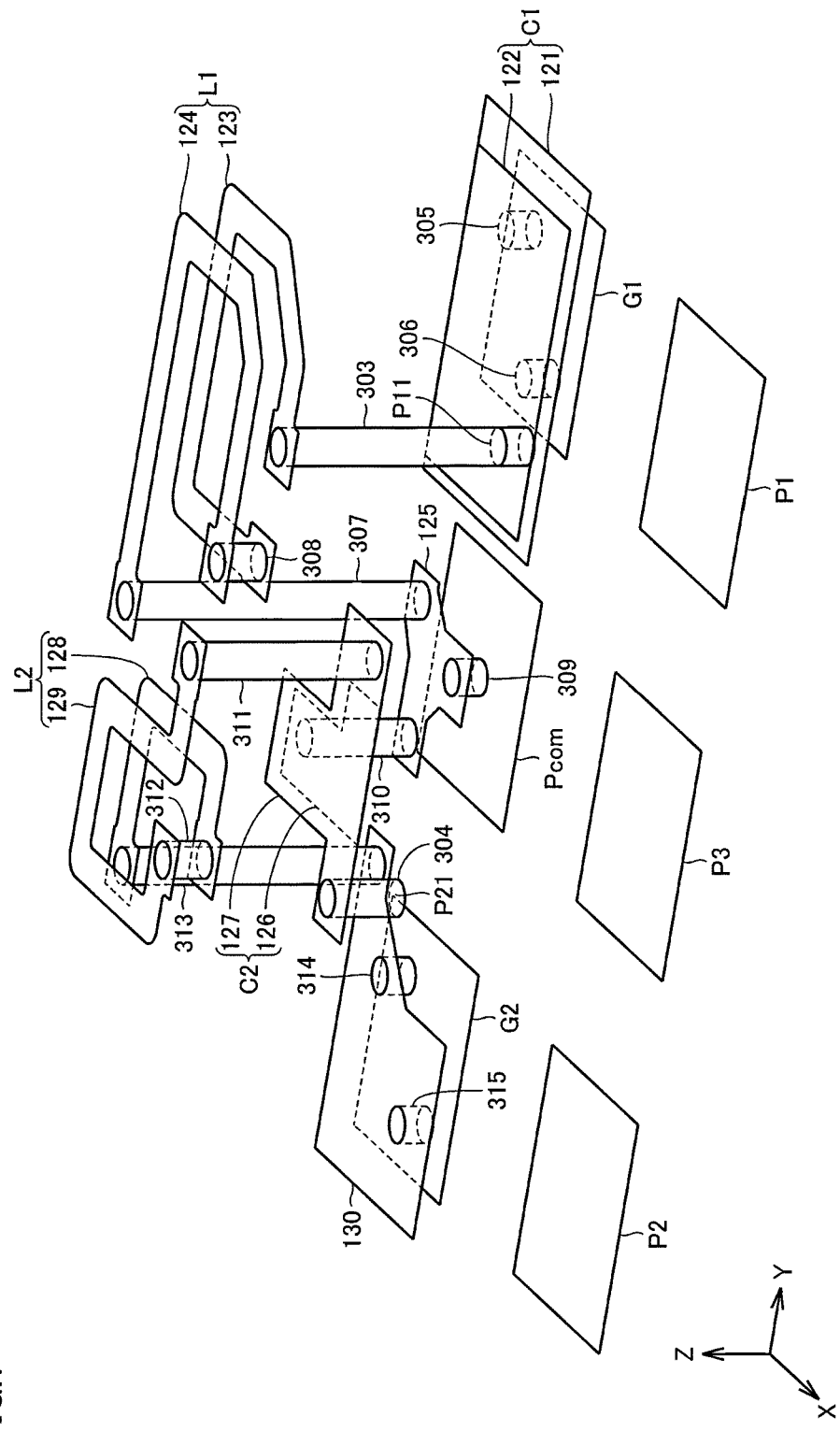
FIG. 7 is a perspective view of a plurality of electrodes defining inductors and capacitors of FIG. 3.

FIG. 7 is a perspective view of the plurality of electrodes defining the inductors L1 and L2 and the capacitors C1 and C2 of FIG. 3. As illustrated in FIG. 7, a plane electrode 121 is connected to the ground terminal G1 by via electrodes 305 and 306. A plane electrode 122 is opposed to the plane electrode 121 in the Z-axis direction. The plane electrodes 121 and 122 define the capacitor C1.

Line electrodes 123 and 124 wind around an axis extending in the Z-axis direction. The line electrode 123 is connected to the plane electrode 122 by the via electrode 303. The line electrode 123 is connected to the line electrode 124 by a via electrode 308. The line electrode 124 is connected to a plane electrode 125 by a via electrode 307. The line electrodes 123 and 124 define the inductor L1.

The plane electrode 125 is connected to the common terminal Pcom by a via electrode 309. The plane electrode 125 is connected to a plane electrode 126 by a via electrode 310. The plane electrode 126 is opposed to a plane electrode 127 in the Z-axis direction. The plane electrodes 126 and 127 define the capacitor C2.

Line electrodes 128 and 129 wind around an axis extending in the Z-axis direction. The line electrode 128 is connected to a plane electrode 130 by a via electrode 313. The line electrode 128 is connected to the line electrode 129 by a via electrode 312. The line electrode 129 is connected to the plane electrode 127 by a via electrode 311. The line electrodes 128 and 129 define the inductor L2. The plane electrode 130 is connected to the ground terminal G2 by via electrodes 314 and 315.

Figure 8:
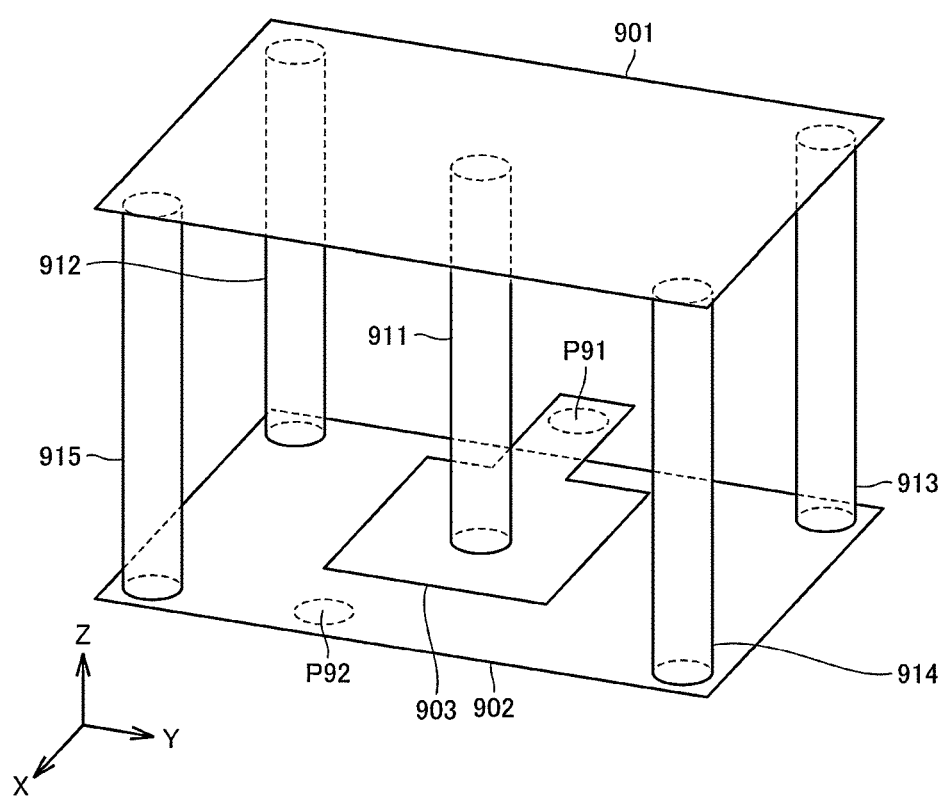
FIG. 8 is a perspective view of a plurality of electrodes of a resonant device according to a comparative example.

FIG. 8 is a perspective view of a plurality of electrodes of a resonant device 9 according to a comparative example. As illustrated in FIG. 8, the resonant device 9 includes plane electrodes 901, 902, and 903 and via electrodes 911, 912, 913, 914, and 915.

The plane electrode 903 is located between the plane electrodes 901 and 902 in a normal direction of the plane electrode 901. The via electrode 911 extends in the Z-axis direction and connects the plane electrodes 901 and 903. The via electrodes 912 to 915 extend in the Z-axis direction and connect the plane electrodes 901 and 902. The via electrodes 912 and 913 are positioned along the Y-axis direction. The via electrodes 913 and 914 are positioned along the X-axis direction. The via electrodes 914 and 915 are positioned along the Y-axis direction. The via electrodes 915 and 912 are positioned along the X-axis direction.

The via electrode 911 is shorter than each of the via electrodes 912 to 915. A distance between the plane electrodes 903 and 902 is shorter than a distance between the plane electrodes 903 and 901.

The via electrodes 911 to 915 define an inductor. The plane electrodes 902 and 903 are opposed to each other in the Z-axis direction and define a capacitor.

The plane electrode 903 includes a portion located between the via electrodes 912 and 913. A terminal P91 is located at the portion. A terminal P92 is located in or on the plane electrode 902. The plane electrode 903 does not include a portion located between the via electrodes 913 and 914, a portion located between the via electrodes 914 and 915, and a portion located between the via electrodes 915 and 912.

Figure 9:
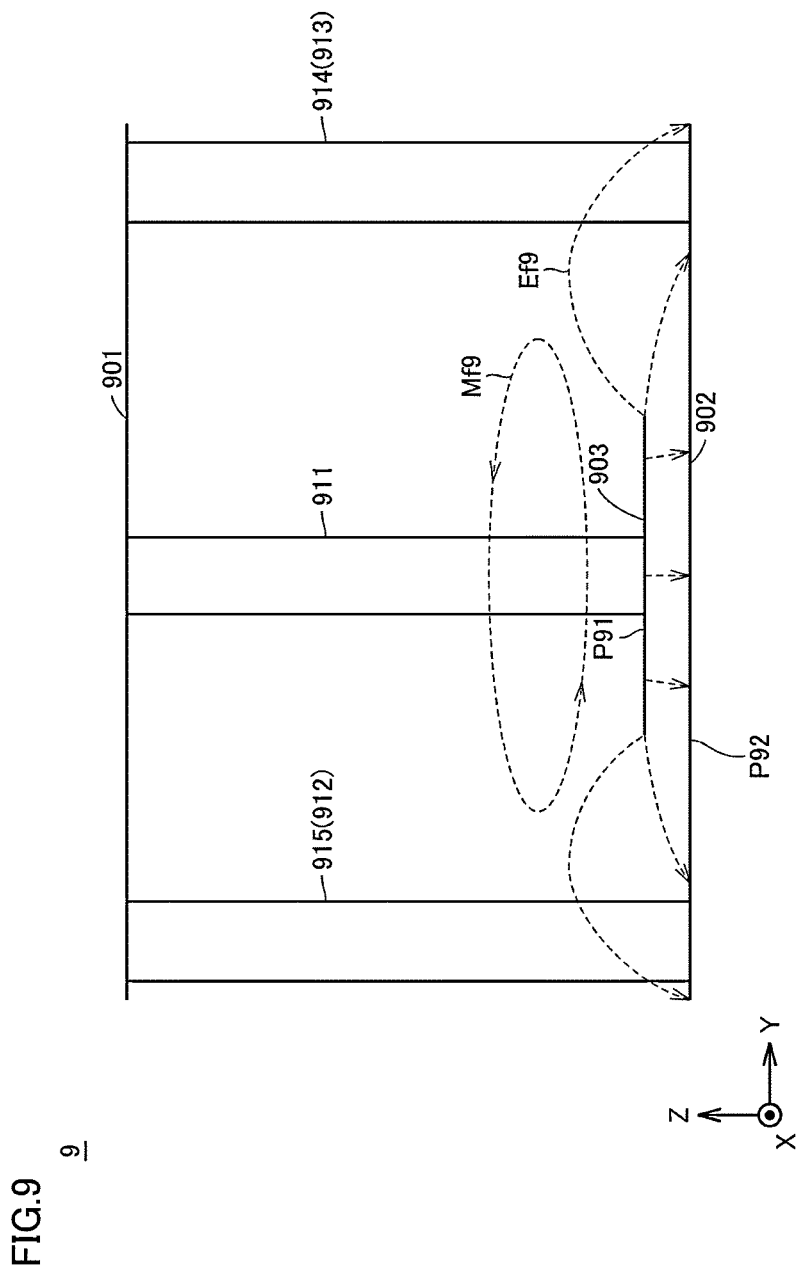
FIG. 9 is a plan view of the resonant device of FIG. 8 when seen in the X-axis direction.

FIG. 9 is a plan view of the resonant device 9 of FIG. 8 when seen in the X-axis direction. In FIG. 9, a broken line Mf9 indicates a magnetic field generated from the via electrode 911. A broken line Ef9 indicates an electric field (line of electric force) generated between the plane electrodes 903 and 902.

As illustrated in FIG. 9, the plane electrode 903 does not include the portion located between the via electrodes 915 and 912 and the portion located between the via electrodes 913 and 914, and thus, a distance between an end portion of the plane electrode 903 and the via electrode 911 is comparatively small. As a result, an electric field caused between the plane electrodes 903 and 901 in the electric field Ef9 generated from the plane electrode 903 may interrupt the magnetic field Mf9. Since inductance of the inductor including the via electrode 911 decreases, a quality factor of the inductor may be reduced. As a result, a quality factor of the resonant device 9 may be reduced.

In this respect, in the resonant device according to the present preferred embodiment, a width of the third plane electrode is increased so that the third plane electrode overlaps with at least two of the first to fourth ranges. Since a distance between an end portion of the third plane electrode and the first via electrode can be larger than the resonant device according to the comparative example, a magnetic field generated from the first via electrode is prevented from being interrupted by an electric field generated from the end portion of the third plane electrode. Since a decrease in inductance of the inductor including the first via electrode can be reduced or prevented, a decrease in a quality factor of the inductor can be reduced or prevented. As a result, a quality factor of the resonant device according to the present preferred embodiment can be improved compared to the resonant device according to the comparative example.

Figure 10:
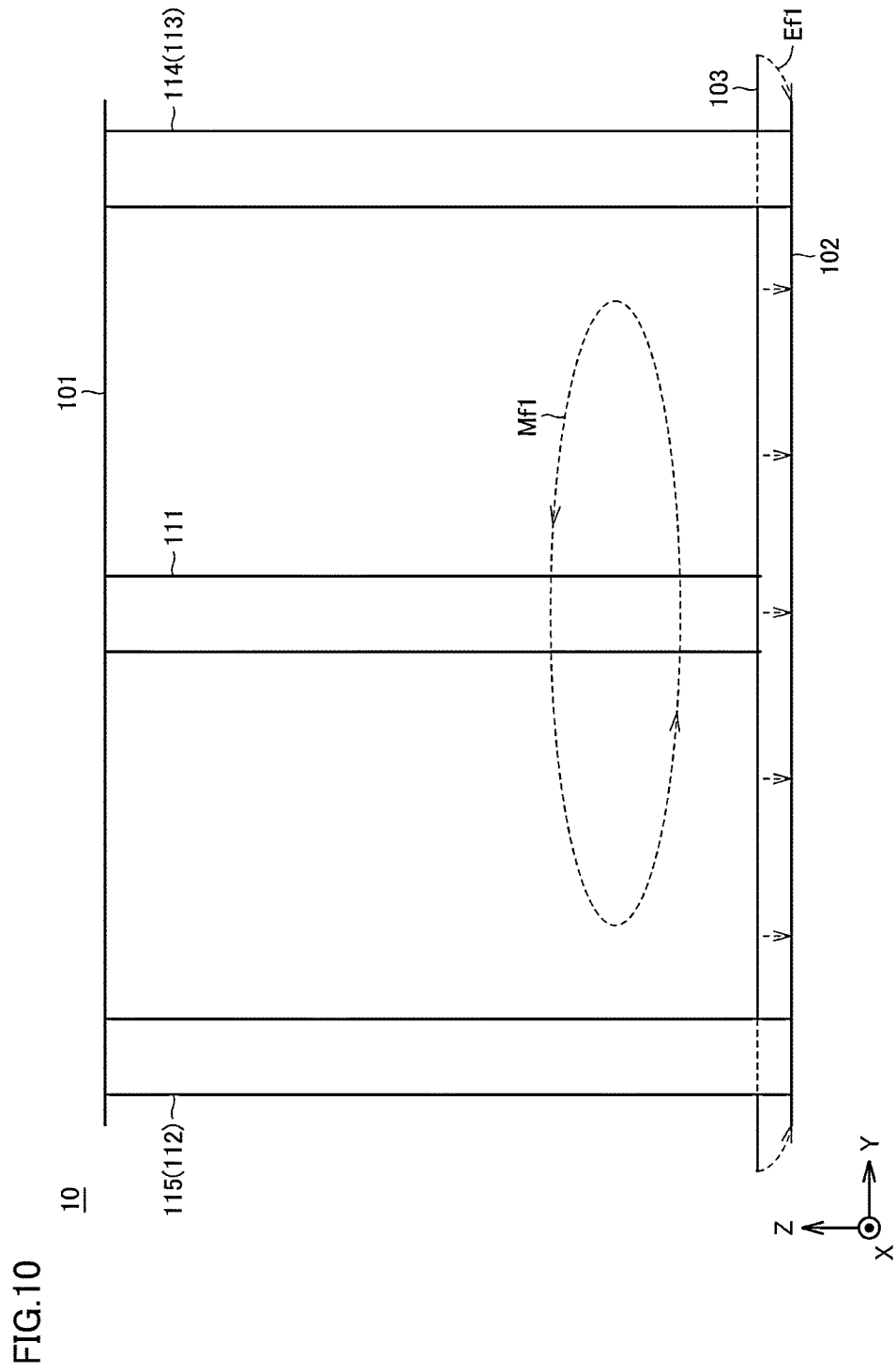
FIG. 10 is a plan view of the resonant device of FIG. 4 when seen in the X-axis direction.

FIG. 10 is a plan view of the resonant device 10 of FIG. 4 when seen in the X-axis direction. In FIG. 10, a broken line Mf1 indicates a magnetic field generated from the via electrode 111. A broken line Ef1 indicates an electric field (line of electric force) generated between the plane electrodes 103 and 102.

As illustrated in FIG. 10, the width of the plane electrode 103 is larger than a width of the plane electrode 102. Since most of the electric field Ef1 is generated between the plane electrodes 103 and 102, the magnetic field Mf1 is hardly interrupted by the electric field Ef1. As a result, the quality factor of the resonant device 10 can be improved compared to the quality factor of the resonant device 9.

Further, even when misalignment of a relative positional relationship is caused between the plane electrodes 102 and 103 due to manufacturing variations, since the plane electrode 103 has the portion (margin) not overlapped with the plane electrode 102, an area of a portion of the plane electrode 103 overlapping with the plane electrode 102 can be prevented from being decreased. Since manufacturing variations in capacitance of the capacitor including the plane electrodes 102 and 103 are reduced or prevented, manufacturing variations in characteristics of the resonant device 10 can be reduced or prevented.

Further, since the width of the plane electrode 103 is comparatively large, the capacitance of the capacitor including the plane electrodes 102 and 103 can be made comparatively large. Thus, it is less necessary to bring the plane electrodes 102 and 103 closer to each other in order to increase the capacitance of the capacitor. Thus, a risk of short circuiting between the plane electrodes 101 and 102 by the via electrode 111 penetrating the plane electrode 103 during the manufacture of the resonant device 10 can be reduced.

As described above, the resonant device according to Preferred Embodiment 1 can improve performance of the resonant device.

Preferred Embodiment 2

Preferred Embodiment 2 describes a configuration in which the capacitance of the capacitor included in the resonant device is adjusted by a plane electrode being added to the resonant device in Preferred Embodiment 1.

Figure 11:
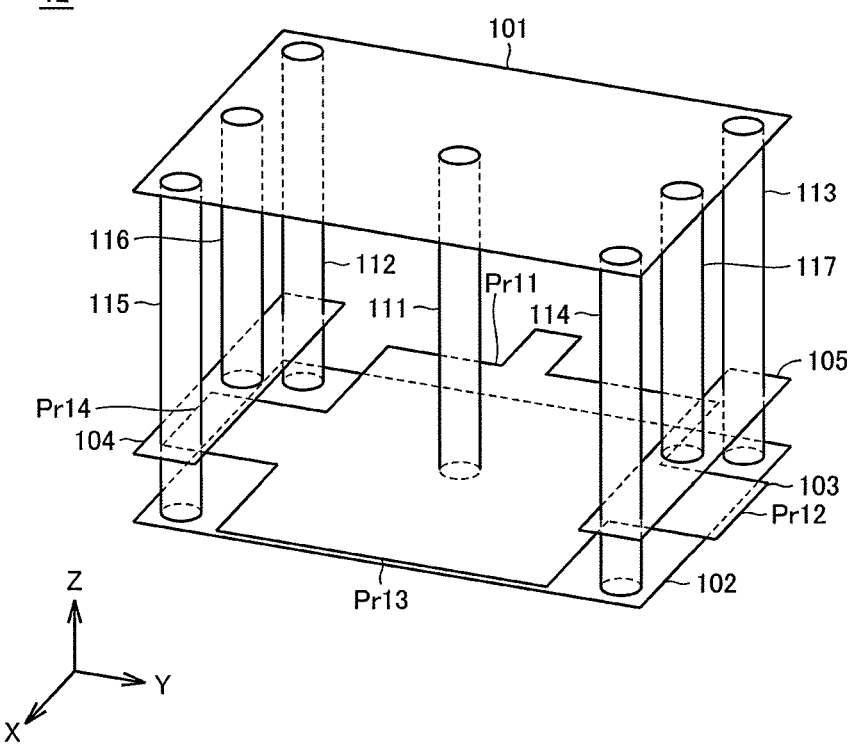
FIG. 11 is a perspective view of a plurality of electrodes of a resonant device according to Preferred Embodiment 2 of the present invention.

FIG. 11 is a perspective view of a plurality of electrodes of a resonant device 12 according to Preferred Embodiment 2. The resonant device 12 has a configuration in which plane electrodes 104 and 105 and via electrodes 116 and 117 are added to the resonant device 10 in FIG. 4. Since other configurations are similar, description is not repeated.

As illustrated in FIG. 11, the plane electrode 104 (fourth plane electrode) is located between the plane electrodes 101 and 103. The plane electrode 104 is opposed to the projecting portion Pr14. The plane electrode 104 connects the via electrodes 112 and 115. The via electrode 116 connects the plane electrodes 101 and 104 between the via electrodes 112 and 115.

The plane electrode 105 is located between the plane electrodes 101 and 103. The plane electrode 105 is opposed to the projecting portion Pr12. The plane electrode 105 connects the via electrodes 113 and 114. The via electrode 117 connects the plane electrodes 101 and 105 between the via electrodes 113 and 114. By the plane electrodes 104 and 105, the capacitance of the capacitor C11 in FIG. 1 is adjusted.

Figure 12:
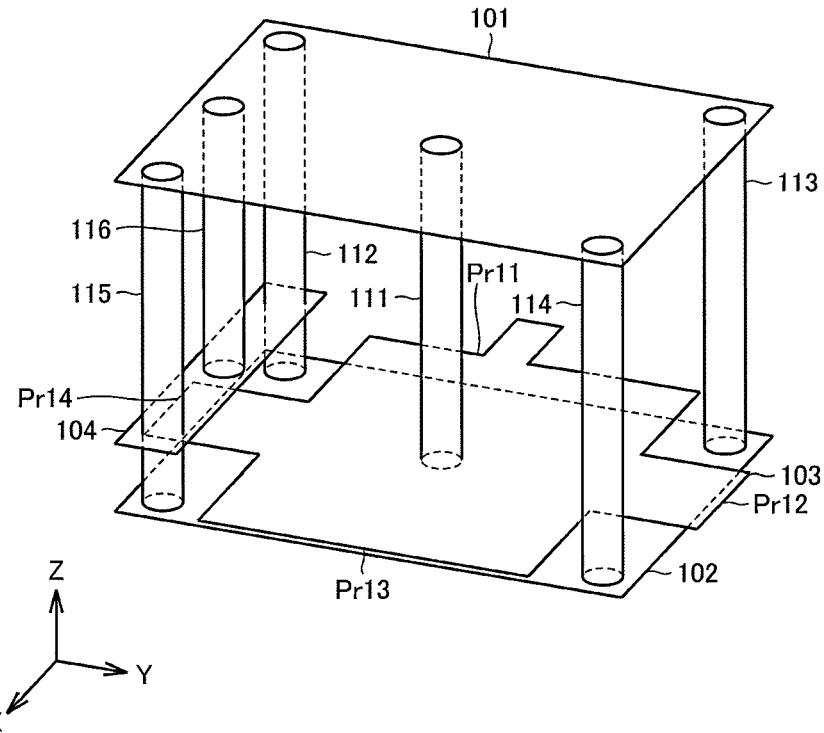
FIG. 12 is a perspective view of a plurality of electrodes of a resonant device according to a modification of Preferred Embodiment 2 of the present invention.

Note that it is unnecessary to add both of the plane electrodes 104 and 105 in order to adjust the capacitance of the capacitor C11, but one of the plane electrodes 104 and 105 may be added. FIG. 12 is a perspective view of a plurality of electrodes of a resonant device 12A according to a modification of Preferred Embodiment 2. The resonant device 12A has a configuration in which the plane electrode 105 and the via electrode 117 are omitted from the resonant device 12 in FIG. 11. Since other configurations are similar, description is not repeated.

As described above, the resonant devices according to Preferred Embodiment 2 and the modification can improve the performance of the resonant devices.

Preferred Embodiment 3

In Preferred Embodiments 1 and 2, the case where all of the projecting portions included in the third plane electrode each have the portion not overlapping with the second plane electrode is described. In Preferred Embodiment 3, a case where the third plane electrode includes a projecting portion not having the concerned portion is described.

Figure 13:
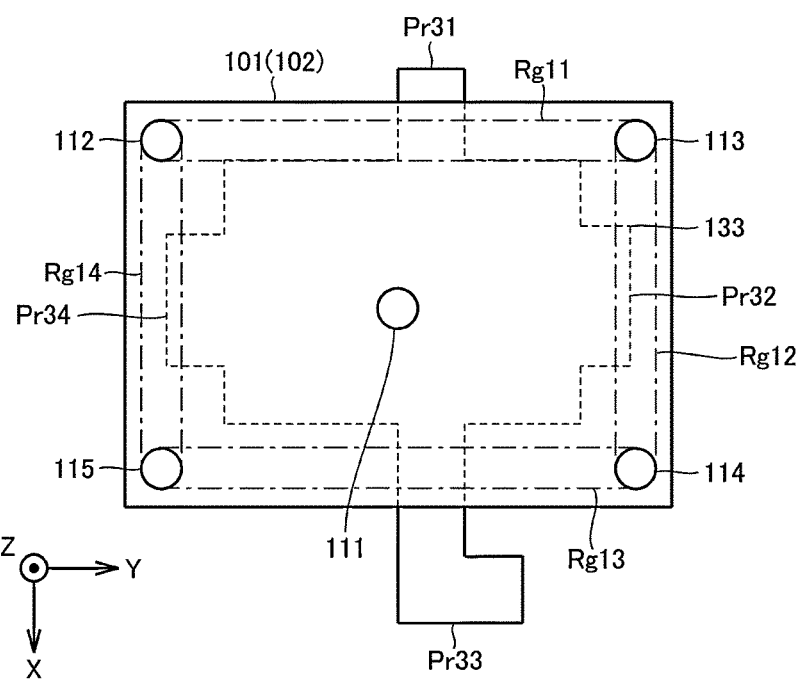
FIG. 13 is a plan view of a plurality of electrodes of a resonant device according to Preferred Embodiment 3 of the present invention when seen in the Z-axis direction.

FIG. 13 is a plan view of a plurality of electrodes of a resonant device 13 according to Preferred Embodiment 3 when seen in the Z-axis direction. The resonant device 13 has a configuration in which the plane electrode 103 of the resonant device 10 in FIG. 6 is replaced by a plane electrode 133 (third plane electrode). Since other configurations are similar, description is not repeated.

As illustrated in FIG. 13, the plane electrode 133 includes a projecting portion Pr31 (first projecting portion) overlapping with the range Rg11, a projecting portion Pr32 overlapping with the range Rg12, a projecting portion Pr33 (third projecting portion) overlapping with the range Rg13, and a projecting portion Pr34 overlapping with the range Rg14.

The projecting portion Pr31 is sandwiched between the via electrodes 112 and 113. The projecting portion Pr32 is sandwiched between the via electrodes 113 and 114. The projecting portion Pr33 is sandwiched between the via electrodes 114 and 115. The projecting portion Pr34 is sandwiched between the via electrodes 115 and 112.

A portion of the projecting portion Pr31 is not overlapped with the plane electrodes 101 and 102. The projecting portion Pr32 is entirely overlapped with the plane electrodes 101 and 102. A portion of the projecting portion Pr33 is not overlapped with the plane electrodes 101 and 102. The projecting portion Pr34 is entirely overlapped with the plane electrodes 101 and 102.

Figure 14:
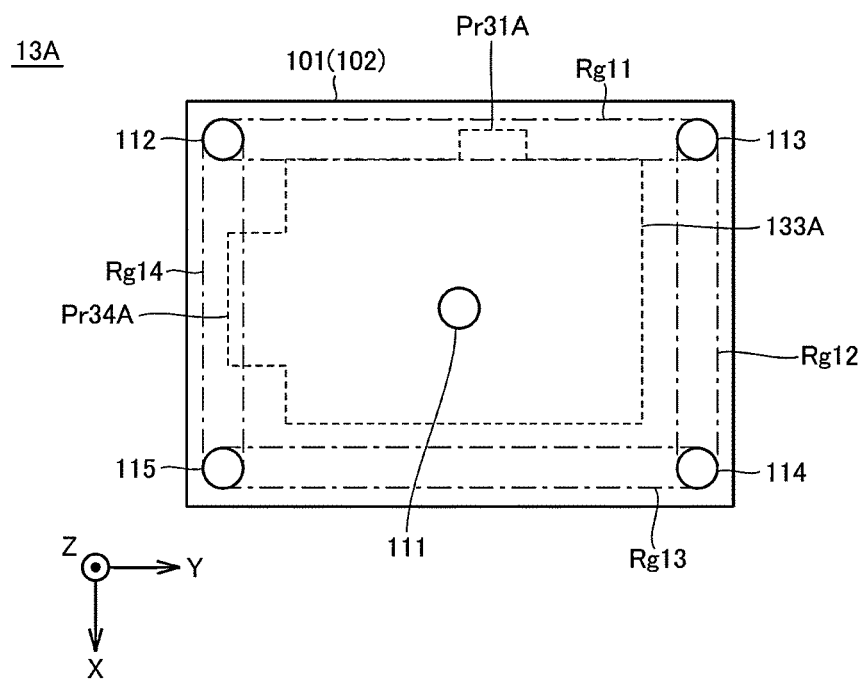
FIG. 14 is a plan view of a plurality of electrodes of a resonant device according to a modification of Preferred Embodiment 3 of the present invention when seen in the Z-axis direction.

FIG. 14 is a plan view of a plurality of electrodes of a resonant device 13A according to a modification of Preferred Embodiment 3 when seen in the Z-axis direction. The resonant device 13A has a configuration in which the projecting portions Pr32 and Pr33 are omitted from the resonant device 13 in FIG. 13, and the projecting portions Pr31 and Pr34 are respectively replaced by Pr31A and Pr34A. Since other configurations are similar, description is not repeated.

As illustrated in FIG. 14, a plane electrode 133A includes the projecting portion Pr31A overlapping with the range Rg11 and the projecting portion Pr34A overlapping with the range Rg14. The projecting portion Pr31A and the projecting portion Pr34A are entirely overlapped with the plane electrodes 101 and 102.

The projecting portion Pr31A is sandwiched between the via electrodes 112 and 113. The projecting portion Pr34A is sandwiched between the via electrodes 115 and 112.

As described above, the resonant devices according to Preferred Embodiment 3 and the modifications can improve the performance of the resonant devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resonant device comprising:
a first plane electrode;
a second plane electrode;
a third plane electrode;
a first via electrode connecting the first plane electrode and the third plane electrode; and
a second via electrode, a third via electrode, and a fourth via electrode connecting the first plane electrode and the second plane electrode; wherein
the third plane electrode is located between the first plane electrode and the second plane electrode in an extending direction of the first via electrode;
the second via electrode and the third via electrode are positioned along a first direction perpendicular or substantially perpendicular to the extending direction of the first via electrode;
the third via electrode and the fourth via electrode are positioned along a second direction perpendicular or substantially perpendicular to the extending direction of the first via electrode and different from the first direction;
when the third plane electrode is seen in plan view:
the first plane electrode, the second plane electrode, or the third plane electrode includes a first projecting portion overlapping with one of a first area between the second via electrode and the third via electrode and a second area between the third via electrode and the fourth via electrode; and
the third plane electrode includes a second projecting portion overlapping with at least one of the first area and the second area and different from the first projecting portion.

2. The resonant device according to claim 1, wherein
the third plane electrode includes the first projecting portion; and
a portion of the first projecting portion is not overlapped with the second plane electrode.

3. The resonant device according to claim 1, wherein
a terminal is provided at the first projecting portion; and
the terminal is not overlapped with the second plane electrode.

4. The resonant device according to claim 1, wherein
a portion of the second projecting portion is not overlapped with the second plane electrode.

5. The resonant device according to claim 1, further comprising:
a fifth via electrode connecting the first plane electrode and the second plane electrode; wherein
the fourth via electrode and the fifth via electrode are positioned along the first direction.

6. The resonant device according to claim 5, wherein
the second projecting portion overlaps with the second area; and
the second plane electrode further includes a third projecting portion overlapping with a third area between the fourth via electrode and the fifth via electrode.

7. The resonant device according to claim 6, wherein
a portion of the third projecting portion is not overlapped with the second plane electrode.

8. The resonant device according to claim 6, wherein
the second plane electrode further includes a fourth projecting portion overlapping with a fourth area between the fifth via electrode and the second via electrode.

9. The resonant device according to claim 8, wherein
a portion of the fourth projecting portion is not overlapped with the second plane electrode.

10. The resonant device according to claim 5, further comprising:
a fourth plane electrode located between the first plane electrode and the third plane electrode and connecting the second via electrode and the fifth via electrode; and
a sixth via electrode connecting the first plane electrode and the fourth plane electrode between the second via electrode and the fifth via electrode.

11. The resonant device according to claim 10, further comprising:
a fifth plane electrode located between the first plane electrode and the third plane electrode and connecting the third via electrode and the fourth via electrode; and
a seventh via electrode connecting the first plane electrode and the fifth plane electrode between the third via electrode and the fourth via electrode.

12. A filter comprising:
the resonant device according to claim 1.

13. The filter according to claim 12, wherein
the third plane electrode includes the first projecting portion; and
a portion of the first projecting portion is not overlapped with the second plane electrode.

14. The filter according to claim 12, wherein
a terminal is provided at the first projecting portion; and
the terminal is not overlapped with the second plane electrode.

15. The filter according to claim 12, wherein
a portion of the second projecting portion is not overlapped with the second plane electrode.

16. The filter according to claim 12, further comprising:
a fifth via electrode connecting the first plane electrode and the second plane electrode; wherein
the fourth via electrode and the fifth via electrode are positioned along the first direction.

17. The filter according to claim 16, wherein
the second projecting portion overlaps with the second area; and
the second plane electrode further includes a third projecting portion overlapping with a third area between the fourth via electrode and the fifth via electrode.

18. The filter according to claim 17, wherein
a portion of the third projecting portion is not overlapped with the second plane electrode.

19. The filter according to claim 17, wherein
the second plane electrode further includes a fourth projecting portion overlapping with a fourth area between the fifth via electrode and the second via electrode.

20. The filter according to claim 19, wherein
a portion of the fourth projecting portion is not overlapped with the second plane electrode.

21. The filter according to claim 16, further comprising:
a fourth plane electrode located between the first plane electrode and the third plane electrode and connecting the second via electrode and the fifth via electrode; and
a sixth via electrode connecting the first plane electrode and the fourth plane electrode between the second via electrode and the fifth via electrode.

22. The filter according to claim 21, further comprising:
a fifth plane electrode located between the first plane electrode and the third plane electrode and connecting the third via electrode and the fourth via electrode; and
a seventh via electrode connecting the first plane electrode and the fifth plane electrode between the third via electrode and the fourth via electrode.

* * * * *